US009966372B2

United States Patent
Kameyama et al.

(10) Patent No.: US 9,966,372 B2
(45) Date of Patent: May 8, 2018

(54) SEMICONDUCTOR DEVICE AND METHOD OF MANUFACTURING SEMICONDUCTOR DEVICE HAVING PARALLEL CONTACT HOLES BETWEEN ADJACENT TRENCHES

(71) Applicant: TOYOTA JIDOSHA KABUSHIKI KAISHA, Toyota-shi, Aichi-ken (JP)

(72) Inventors: Satoru Kameyama, Toyota (JP); Tadashi Misumi, Nisshin (JP); Jun Okawara, Nisshin (JP); Shinya Iwasaki, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days. days.

(21) Appl. No.: 15/325,954

(22) PCT Filed: Jun. 8, 2015

(86) PCT No.: PCT/JP2015/066523
§ 371 (c)(1),
(2) Date: Jan. 12, 2017

(87) PCT Pub. No.: WO2016/021299
PCT Pub. Date: Feb. 11, 2016

(65) Prior Publication Data
US 2017/0162563 A1 Jun. 8, 2017

(30) Foreign Application Priority Data
Aug. 6, 2014 (JP) ................................ 2014-160719

(51) Int. Cl.
*H01L 29/66* (2006.01)
*H01L 27/07* (2006.01)
(Continued)

(52) U.S. Cl.
CPC ...... *H01L 27/0716* (2013.01); *H01L 21/8249* (2013.01); *H01L 23/5226* (2013.01);
(Continued)

(58) Field of Classification Search
CPC .......................... H01L 27/0719; H01L 29/417
(Continued)

(56) References Cited

U.S. PATENT DOCUMENTS

| 2002/0158287 A1* | 10/2002 | Fujishima | ......... H01L 21/76838 257/325 |
| 2004/0256666 A1* | 12/2004 | Fujishima | ....... H01L 21/823487 257/329 |

(Continued)

FOREIGN PATENT DOCUMENTS

| JP | 2011-044494 A | 3/2011 |
| JP | 2012-114321 A | 6/2012 |

(Continued)

*Primary Examiner* — Jami M Valentine
(74) *Attorney, Agent, or Firm* — Oliff PLC

(57) ABSTRACT

A semiconductor device includes: a plurality of trenches provided in an upper surface of a semiconductor substrate; trench electrodes each provided in a corresponding one of the trenches; a first semiconductor layer of a first conductivity type provided in a first range interposed between adjacent ones of the trenches; a second semiconductor layer of a second conductivity type; a third semiconductor layer of the first conductivity type; an interlayer insulation film provided on the upper surface of the semiconductor substrate and including a plurality of contact holes; a first conductor layer provided in each of the contact holes; and a surface electrode provided on the interlayer insulation film and connected to each of the first conductor layers.

8 Claims, 8 Drawing Sheets

(51) Int. Cl.
*H01L 29/417* (2006.01)
*H01L 29/06* (2006.01)
*H01L 29/739* (2006.01)
*H01L 29/861* (2006.01)
*H01L 21/8249* (2006.01)
*H01L 23/522* (2006.01)
*H01L 23/528* (2006.01)

(52) U.S. Cl.
CPC ...... *H01L 23/5283* (2013.01); *H01L 29/0696* (2013.01); *H01L 29/417* (2013.01); *H01L 29/41708* (2013.01); *H01L 29/7397* (2013.01); *H01L 29/861* (2013.01)

(58) Field of Classification Search
USPC .......................................................... 257/140
See application file for complete search history.

(56) References Cited

U.S. PATENT DOCUMENTS

| | | |
|---|---|---|
| 2015/0008479 A1 | 1/2015 | Kato et al. |
| 2015/0295042 A1 | 10/2015 | Kameyama et al. |
| 2015/0333190 A1 | 11/2015 | Aketa et al. |

FOREIGN PATENT DOCUMENTS

| | | |
|---|---|---|
| JP | 2014-013850 A | 1/2014 |
| JP | 2014-116471 A | 6/2014 |
| WO | 2013/121519 A1 | 8/2013 |
| WO | 2014/097454 A1 | 6/2014 |

\* cited by examiner

SEMICONDUCTOR DEVICE AND METHOD OF MANUFACTURING SEMICONDUCTOR DEVICE HAVING PARALLEL CONTACT HOLES BETWEEN ADJACENT TRENCHES

CROSS-REFERENCE TO RELATED APPLICATION

This application claims priority to Japanese Patent Application No. 2014-160719 filed on Aug. 6, 2014, the entire contents of which are hereby incorporated by reference into the present application.

TECHNICAL FIELD

The art disclosed herein relates to a semiconductor device such as an IGBT and a MOSFET.

BACKGROUND ART

International Publication No. WO 2013/121519 A1 (hereinafter referred to as Patent Literature 1) discloses a semiconductor device for switching that has trench type gate electrodes. The semiconductor device has an interlayer insulation film disposed above the gate electrodes. A surface electrode is disposed on a substantially entire upper surface of a semiconductor substrate so as to cover the interlayer insulation film. The interlayer insulation film insulates the gate electrodes from the surface electrode.

SUMMARY OF INVENTION

Technical Problem

In Patent Literature 1, the interlayer insulation film is not arranged on a semiconductor layer in a range interposed between a pair of the adjacent gate electrodes. The surface electrode is connected to the semiconductor substrate in a range where the interlayer insulation film is not arranged. That is, an almost entire part of the range interposed between the pair of gate electrodes serves as a contact hole, and in the almost entire part of this range, the surface electrode and the semiconductor substrate make contact. With this structure, the surface electrode that is situated above the interlayer insulation film protrudes relative to the surface electrode that is situated in its surroundings, leading to generation of protrusions and depressions on a surface of the surface electrode. Therefore, the present description provides a semiconductor device capable of suppressing protrusions and depressions on a surface electrode.

Solution to Technical Problem

As a measure to resolve the protrusions and depressions on the surface electrode, etching back the surface electrode can be considered. That is, the surface electrode is etched back from its front surface side and the surface electrode is left to remain only in the contact hole. Then, an electrode is grown again on the electrode in the contact hole and the interlayer insulation film. In this measure, however, since the contact hole is large, an etching rate is accelerated at a center of the contact hole, as a result of which the surface of the electrode is undesirably depressed at the center of the contact hole after the etching back. Due to this, even if the electrode is grown again thereafter, a concave is undesirably left in the surface of the electrode. In order to resolve this problem, widening a width of the interlayer insulation film and making the contact hole small can be considered. If the contact hole is made small, the above mentioned depression becomes less likely to be generated. However, if the contact hole is made small, a contact area between the surface electrode and the semiconductor substrate is decreased, causing a problem that an electric current concentrates at a contact part therein.

On the other hand, a semiconductor device disclosed herein comprises a following configuration. The semiconductor device comprises a semiconductor substrate. The semiconductor device comprises a plurality of trenches provided in an upper surface of the semiconductor substrate; trench insulating films covering a corresponding one of inner surfaces of the trenches; trench electrodes each provided in a corresponding one of the trenches and insulated from the semiconductor substrate by the trench insulating film; a first semiconductor layer of a first conductivity type provided in the semiconductor substrate in a first range interposed between adjacent two of the trenches, exposed on the upper surface of the semiconductor substrate, and being in contact with the trench insulating film; a second semiconductor layer of a second conductivity type provided in the semiconductor substrate in the first range, a part of the second semiconductor layer being exposed on the upper surface of the semiconductor substrate, and the second semiconductor layer being in contact with the trench insulating film on a lower side of the first semiconductor layer; a third semiconductor layer of the first conductivity type provided in the semiconductor substrate, provided on a lower side of the second semiconductor layer, separated from the first semiconductor layer by the second semiconductor layer, and being in contact with the trench insulating film on the lower side of the second semiconductor layer; an interlayer insulating film provided on the upper surface of the semiconductor substrate and on the trench electrodes, and comprising a plurality of contact holes provided in the first range; first conductor layers each provided in a corresponding one of the contact holes and connected to at least one of the first semiconductor layer and the second semiconductor layer; and a surface electrode provided on the first conductor layers and the interlayer insulating film and connected to each of the first conductor layers.

Since this semiconductor device has the plurality of contact holes in the first range interposed between the trenches, the size of each contact hole is small. Since the size of each contact hole is small, the protrusions and depressions on the surface of the surface electrode can be suppressed. Further, in this semiconductor device, the semiconductor substrate and the surface electrode are connected via the plurality of contact holes. Therefore, compared to when a single contact hole having a small size is disposed in the first range, the contact area of the surface electrode relative to the semiconductor substrate can be secured wide. Therefore, it is possible to suppress current from concentrating in one contact hole.

Advantageous Effects of Invention

According to the above semiconductor device, a surface electrode can be made flat and also a wide contact area of the surface electrode can be secured.

DESCRIPTION OF EMBODIMENTS

Figure 1:
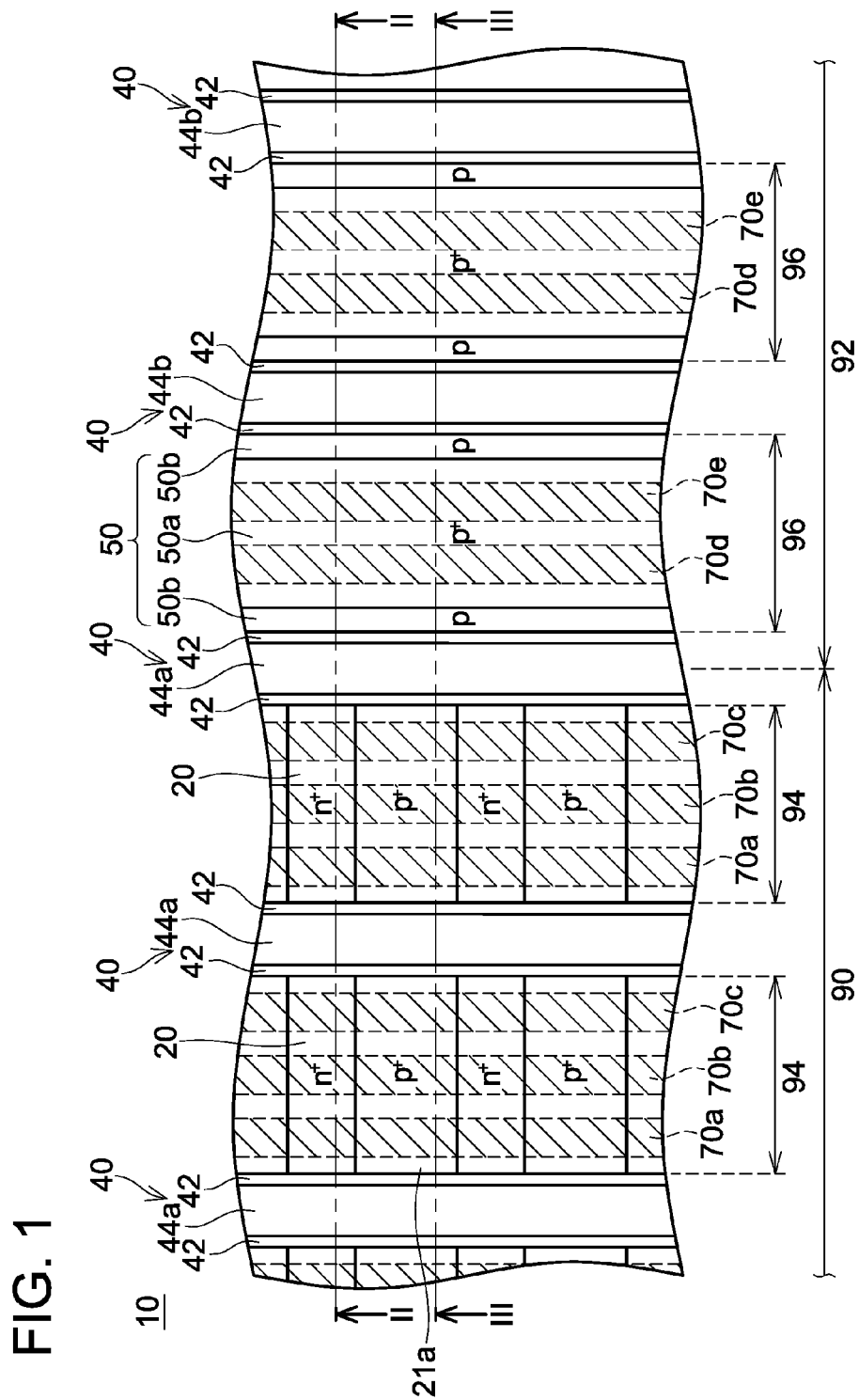
FIG. 1 shows a top view of a semiconductor substrate of an IGBT 10 according to an embodiment (omitting illustration of an upper electrode 60)
Figure 2:
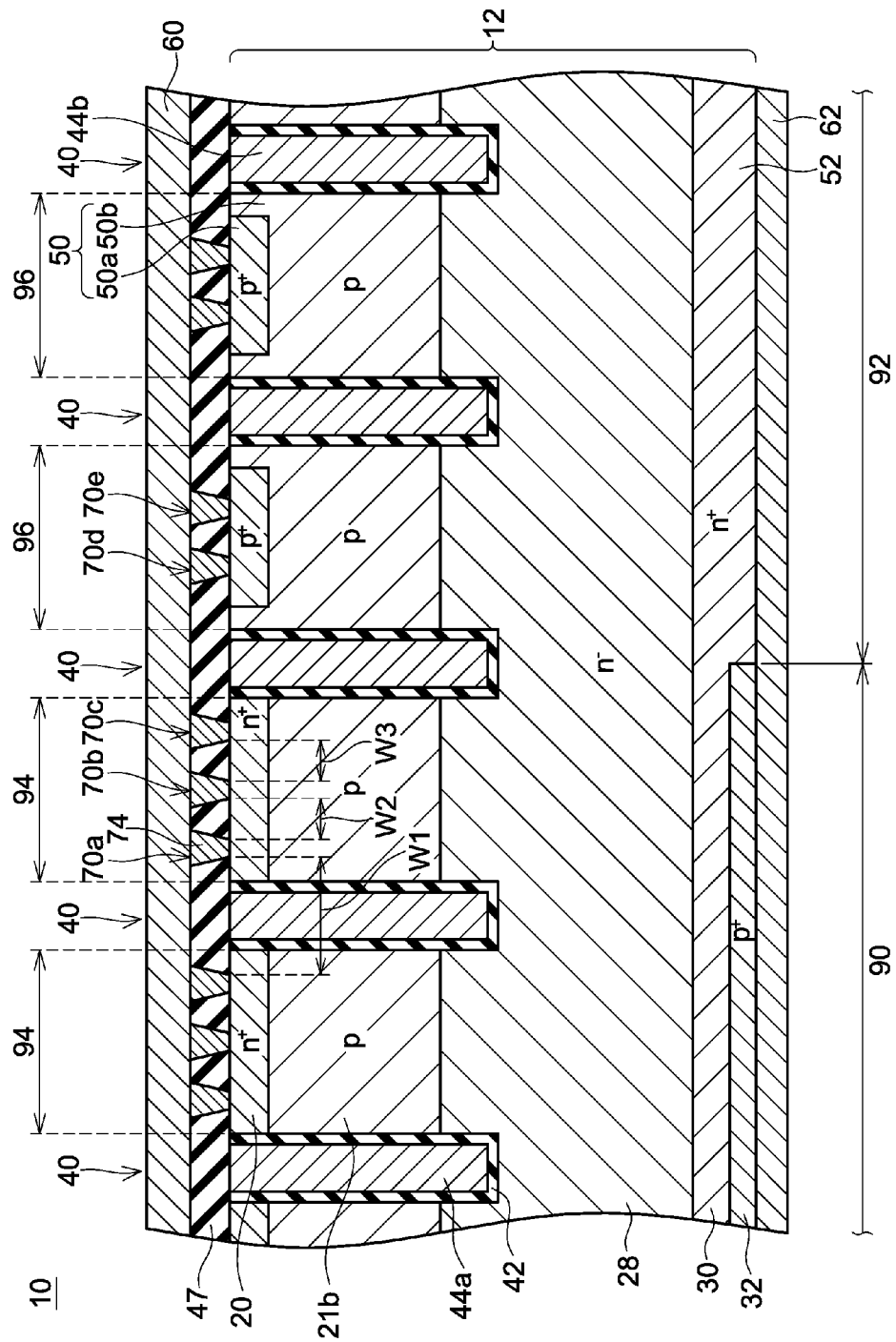
FIG. 2 shows a cross section taken along II-II of the IGBT 10 according to the embodiment.
Figure 3:
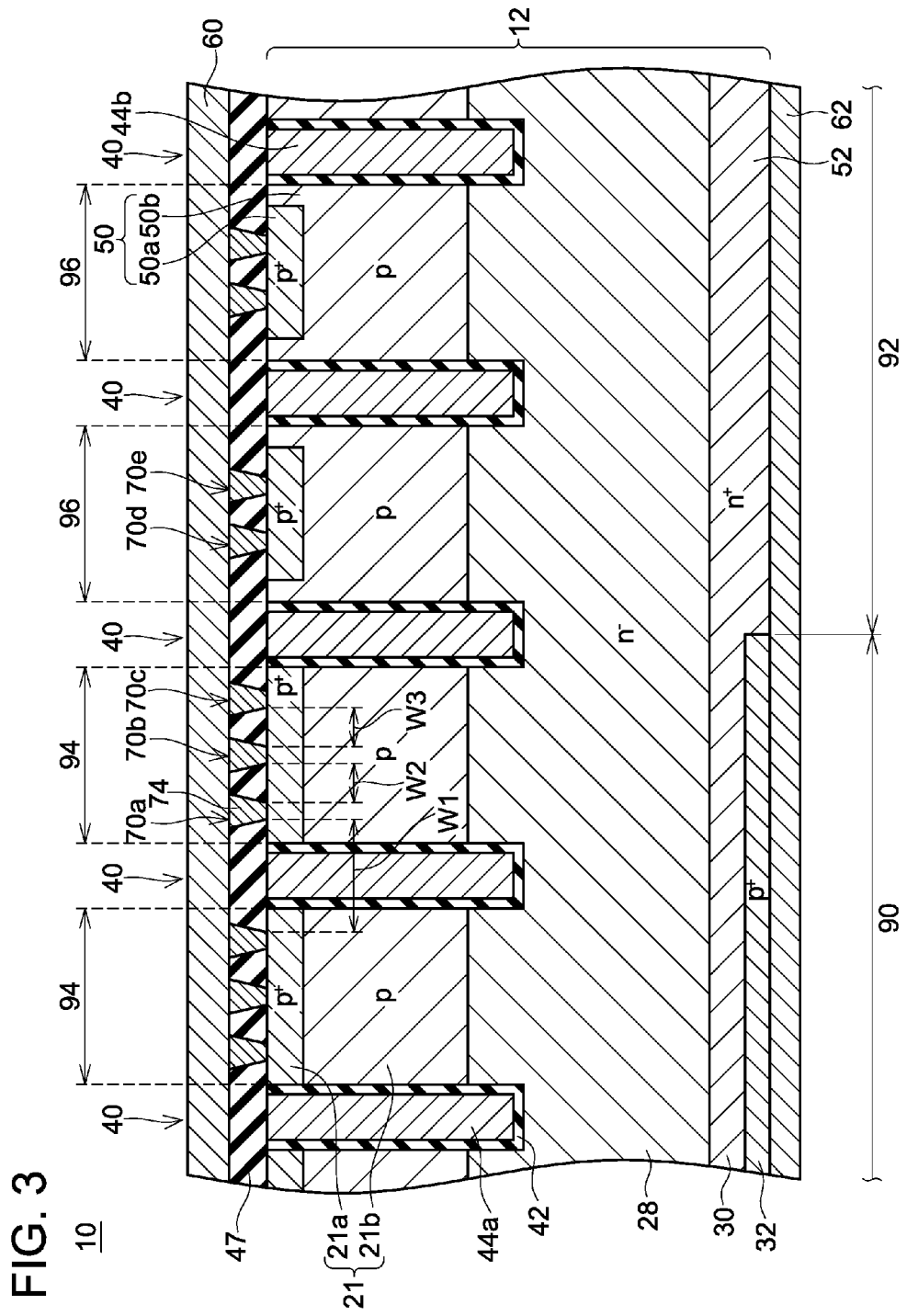
FIG. 3 shows a cross section taken along III-III of the IGBT 10 according to the embodiment.

A semiconductor device 10 according to an embodiment shown in FIGS. 1 to 3 is an RC-IGBT which comprises IGBT and diode. The semiconductor device 10 comprises a semiconductor substrate 12, and electrodes and insulators, etc. provided on upper and lower surfaces of the semiconductor substrate 12. The semiconductor substrate 12 includes an IGBT region 90 in which the IGBT is provided and a diode region 92 in which the diode is provided.

As shown in FIGS. 2 and 3, a plurality of trenches 40 is provided concavely in the upper surface of the semiconductor substrate 12. As shown in FIG. 1, the respective trenches 40 extend parallel to each other. An inner surface of each trench 40 is covered with an insulation film 42.

As shown in FIGS. 2 and 3, a trench electrode 44 (44a, 44b) is disposed inside each trench 40. Each trench electrode 44 is insulated from the semiconductor substrate 12 by the insulation film 42. Each trench electrode 44a within the IGBT region 90 is connected to a gate wiring at a position not shown. Each trench electrode 44b within the diode region 92 is connected to an upper electrode 60 that will be described later at a position not shown. Hereinbelow, the trench electrodes 44a connected to the gate wiring may be called gate electrodes 44a, and the trench electrodes 44b connected to the upper electrode 60 may be called control electrodes 44b.

An interlayer insulation film 47 is disposed on the upper surface of the semiconductor substrate 12 and the trench electrodes 44. Portions of the interlayer insulation film 47 are disposed in ranges 94 and 96, each of which is interposed between two trenches 40. Further, a portion of the interlayer insulation film 47 covers an upper surface of each trench electrode 44. A plurality of contact holes 70a to 70e is provided in the interlayer insulation film 47. The contact holes 70a to 70c are disposed in the ranges 94 interposed between two trenches 40 within the IGBT region 90. In each of the ranges 94 interposed between two trenches 40 within the IGBT region 90, the three contact holes 70a to 70c are disposed. The contact holes 70d and 70e are disposed in the ranges 96 interposed between two trenches 40 within the diode region 92. In each of the ranges 96 interposed between two trenches 40 within the diode region 92, the two contact holes 70d and 70e are disposed. A range hatched by oblique lines of FIG. 1 indicates a range in which the contact holes 70a to 70b are disposed. As shown in FIGS. 2 and 3, a conductive layer 74 is disposed in each of the contact holes 70a to 70e. Each conductive layer 74 is constituted of tungsten. Each conductive layer 74 is connected to the semiconductor substrate 12 at its lower end.

The upper electrode 60 is disposed on the conductive layers 74 and the interlayer insulation film 47. The upper electrode 60 is insulated from the trench electrodes 44 by the interlayer insulation film 47. Further, the upper electrode 60 is connected to the conductive layers 74 in the contact holes 70a to 70e. That is, the upper electrode 60 is connected via the conductive layers 74 in the contact holes 70a to 70c to emitter regions 20 and body contact regions 21a, which will be described later. Further, the upper electrode 60 is connected via the conductive layers 74 in the contact holes 70d and 70e to anode contact regions 50a, which will be described later. Notably, the upper electrode 60 being connected to a semiconductor layer via the conductive layers 74 in the contact holes 70 may be referred to as the upper electrode 60 being connected to the semiconductor layer via the contact holes 70. The upper electrode 60 is constituted of aluminum. Young's modulus of the upper electrode 60 (i.e. aluminum) is lower than Young's modulus of the conductive layers 74 (i.e. tungsten).

A lower electrode 62 is disposed on the lower surface of the semiconductor substrate 12.

In the semiconductor substrate 12 within the IGBT region 90, the emitter regions 20, a body region 21, a drift region 28, a buffer region 30, and a collector region 32 are provided.

The emitter regions 20 are n-type regions, and are disposed in a range exposed on the upper surface of the semiconductor substrate 12. The emitter regions 20 are connected to the upper electrode 60 via the contact holes 70a to 70c. As shown in FIG. 1, the emitter regions 20 extend long along a direction intersecting the trench electrodes 44. The emitter regions 20 are in contact with the insulation film 42.

As shown in FIGS. 2 and 3, the body region 21 includes the body contact regions 21a and a low concentration body region 21b. Each body contact region 21a is a p-type region containing p-type impurities of a high concentration. Each body contact region 21a is provided in a range exposed on the upper surface of the semiconductor substrate 12. As shown in FIG. 1, the body contact regions 21a extend long along the direction intersecting the trench electrodes 44. The body contact regions 21a are respectively adjacent to the emitter regions 20. The body contact regions 21a are connected to the upper electrode 60 via the contact holes 70a to 70e.

The low concentration body region 21b is a p-type region a p-type impurity concentration of which is lower than that of the body contact regions 21a. The low concentration body region 21b is disposed below the emitter regions 20 and the body contact regions 21a. The low concentration body region 21b is in contact with the insulation film 42 below the emitter regions 20.

The drift region 28 is an n-type region containing n-type impurities with a lower concentration than the emitter regions 20. The drift region 28 is disposed below the low concentration body region 21b. The drift region 28 is separated from the emitter regions 20 by the low concentration body region 21b. The drift region 28 is in contact with the insulation film 42 below the low concentration body region 21b.

The buffer region 30 is an n-type region containing n-type impurities with a higher concentration than the drift region 28. The buffer region 30 is disposed below the drift region 28.

The collector region 32 is a p-type region containing p-type impurities with a high concentration. The collector region 32 is disposed below the buffer region 30. The collector region 32 is disposed in a range exposed on the lower surface of the semiconductor substrate 12. The collector region 32 is connected to the lower electrode 62.

In the semiconductor substrate 12 within the diode region 92, an anode region 50, the drift region 28 and a cathode region 52 are provided.

The anode region 50 includes anode contact regions 50a and a low concentration anode region 50b. The anode contact regions 50a are p-type regions containing p-type impurities with a high concentration. The anode contact regions 50a are disposed in a range exposed on the upper surface of the semiconductor substrate 12. As shown in FIG. 1, the anode contact regions 50a extend long and parallel to the trench electrodes 44. The anode contact regions 50a are connected to the upper electrode 60 via the contact holes 70d and 70e.

The low concentration anode region 50b is a p-type region the p-type impurity concertation of which is lower than that of the anode contact regions 50a. As shown in FIGS. 2 and 3, the low concentration anode region 50b is disposed laterally next to and under the anode contact regions 50a.

The above-mentioned drift region 28 is disposed below the low concentration anode region 50b. That is, a portion of the drift region 28 is disposed below the low concertation anode region 50b. The drift region 28 is in contact with the low concentration anode region 50b.

The cathode region 52 is an n-type region containing n-type impurities with a higher concentration than the drift region 28. The cathode region 52 is disposed below the drift region 28 within the diode region 92. The cathode region 52 is continuous with the buffer region 30. Further, the cathode region 52 is adjacent to the collector region 32. The cathode region 52 is disposed in a range exposed on the lower surface of the semiconductor substrate 12. The cathode region 52 is connected to the lower electrode 62.

Intervals between the trenches 40 are equal between the IGBT region 90 and the diode region 92. Due to this, in a plan view of the semiconductor substrate 12 from above, an area S1 of each range 94 and an area S2 of each range 96 are equal to each other. Further, sizes of the respective contact holes 70a to 70e are substantially equal to each other. Due to this, an area Sa with which the contact hole 70a makes contact with the semiconductor substrate 12, an area Sb with which the contact hole 70b makes contact with the semiconductor substrate 12, an area Sc with which the contact hole 70c makes contact with the semiconductor substrate 12, an area Sd with which the contact hole 70d makes contact with the semiconductor substrate 12, and an area Se with which the contact hole 70e makes contact with the semiconductor substrate 12 are equal to each other. Further, as mentioned above, in the IGBT region 90, the three contact holes 70a to 70c are disposed in each range 94 interposed between two trenches 40, whereas in the diode region 92 the two contact holes 70d and 70e are disposed in each range 96 interposed between two trenches 40. Therefore, a ratio in contact area of the contact holes 70a to 70e to each range 94 in the IGBT region 90 is greater than a ratio in contact area of the contact holes 70d and 70e to each range 96. More in detail, a relation of (Sa+Sb+Sc)/S1>(Sd+Se)/S2 is satisfied.

An operation of the IGBT in the IGBT region 90 will be described. When the IGBT is operated, a voltage that charges the lower electrode 62 positively is applied between the upper electrode 60 and the lower electrode 62. When a gate voltage (voltage applied to the gate electrodes 44a) is raised higher than a gate threshold (minimum gate voltage requisite for turning on the IGBT) in this state, the IGBT is turned on. That is, the application of a voltage to the gate electrodes 44a causes channels to be generated in a range of the low concentration body region 21b that is in contact with each gate insulation film 42. Due to this, electrons flow from the upper electrode 60 to the lower electrode 62 through the emitter regions 20, the channels in the low concentration body region 21b, the drift region 28, the buffer region 30, and the collector region 32. Furthermore, holes flow from the lower electrode 62 to the upper electrode 62 through the collector region 32, the buffer region 30, the drift region 28, the low concentration body region 21b, and the body contact regions 21a. Due to this, a current flow though the IGBT.

When the holes are flowing from the body contact regions 21a to the upper electrode 60 while the IGBT is on, the holes pass through the contact holes 70a to 70c. Since the holes flow from the body contact regions 21a through the plurality of contact holes 70a to 70e to the upper electrode 60, the holes flow separately through the respective contact holes 70a to 70c. Due to this, concentration of a current to a single contact hole can be prevented. Therefore, for example, it is possible to avoid a situation where, in ease an overvoltage is applied to the IGBT, a current concentrates on a single contact hole and consequently surroundings of the contact hole are overly heated. Due to this, the IGBT of the semiconductor device 10 according to the embodiment has a high short-circuit resistance.

By lowering the gate voltage to be lower than the gate threshold, the channels disappear, turning off the IGBT. At this occasion, the holes existing in the drift region 28 are discharged through the low concentration body region 21b and the body contact regions 21a to the upper electrode 60. In this case, the holes flow through the plurality of contact holes 70a to 70c to the upper electrode 60. Due to this, the concentration of a current to a single contact hole can be prevented. Therefore, the IGBT of the semiconductor device 10 according to the embodiment has wide voltage and current ranges within which the semiconductor device is capable of operating appropriately during turn-off, and thus has a high RBSOA resistance.

Further, if an overvoltage is applied between the upper electrode 60 and the lower electrode 62 when the IGBT is turned off or IGBT is off, there may be a case where holes are generated by a high electric field in the drift region 28 within the IGBT region 90. In this case, the holes flow through the contact holes 70a to 70c to the upper electrode 60. Due to this, the generated holes can be discharged into the upper electrode 60 within a short amount of time, an occurrence of avalanche breakdown in the drift region 28 can be suppressed. Due to this, the IGBT of the semiconductor device 10 according to the embodiment has a high avalanche resistance.

Next, an operation of the diode will be described. When a voltage that charges the upper electrode 60 positively (i.e., a forward voltage) is applied between the upper electrode 60 and the lower electrode 62, the diode in the diode region 92 is turned on. That is, holes flow from the upper electrode 60 to the lower electrode 62 through the anode contact regions 50a, the low concentration anode region 50b, the drift region 28, and the cathode region 52. Further, electrons flow from the lower electrode 62 to the upper electrode 60 through the cathode region 52, the drift region 28, the low concentration anode region 50b, and the anode contact regions 50a. Due to this, a current flows in the diode. Thereafter, when the voltage applied to the diode is switched from the forward voltage to a reverse voltage, the diode performs a reverse recovery operation. That is, the holes existing in the drift region 28 are discharged through the low concentration anode region 50b and the anode contact regions 50a to the upper electrode 60. Due to this, a reverse current momentarily flows in the diode. When all the holes in the drift region 28 are discharged to the upper electrode 60, the reverse current becomes substantially zero.

In the semiconductor device 10 according to the present embodiment, the area with which the conductive layers 74 in the contact holes 70d and 70e make contact with the semiconductor substrate 12 is small. Due to this, an amount of the holes flowing from the upper electrode 60 into the semiconductor substrate 12 when the diode is on is small. Therefore, the amount of the holes existing in the drift region 28 in the diode during the reverse recovery operation is small. Due to this, the amount of the holes discharged into the upper electrode 60 during the reverse recovery operation is small. Therefore, the reverse current flowing in the diode during the reverse recovery operation is suppressed.

As explained above, in the semiconductor device 10 of the present embodiment, by having the plurality of contact holes 70a to 70c in the ranges 94 in the IGBT region 90, the IGBT short-circuit resistance, the RBSOA resistance and the avalanche resistance are improved. Especially since the ratio of the contact area of the contact holes is greater in the IGBT region 90 than in the diode region 92, these characteristics are more effectively improved in the IGBT region 90. Further, in the semiconductor device 10 according to the present embodiment, since the ratio of the contact area of the contact holes is smaller in the diode region 92 than in the IGBT region 90, reverse current in the diode is suppressed.

Further, in the semiconductor device 10 according to the above-mentioned embodiment, the Young's modulus of the conductive layers 74 in the respective contact holes is higher than the Young's modulus of the upper electrode 60. A crack may be generated in the upper electrode 60 by several kinds of stresses. If the conductive layers 74 have high Young's modulus as mentioned above, the crack generated in the upper electrode 60 can be suppressed from running toward a semiconductor substrate 12 side. Due to this, reliability of the semiconductor device 10 is improved.

A width W1 of the interlayer insulation film 47 on each gate electrode 44a (see FIG. 2) is wider than each of widths W2 and W3 of the interlayer insulation film 47 on the semiconductor layers. That is, an interval W1 between the contact hole 70c and the contact hole 70a is wider than an interval W2 between the contact hole 70a and the contact hole 70b and an interval W3 between the contact hole 70b and the contact hole 70c. By thus widening the width W1 of the interlayer insulation film 47 on each gate electrode 44a, even when a position of the interlayer insulation film 47 is displaced relative to the gate electrodes 44a, the upper surfaces of the gate electrodes 44a can surely be covered by the interlayer insulation film 47. Due to this, decrease in yield due to the misalignment of a contact hole and/or defect formation of the trenches 40 can be suppressed.

Further, since the contact holes 70a to 70c each have a narrow width, the freedom of layout of the contact holes 70a to 70c can be secured.

Figure 4:
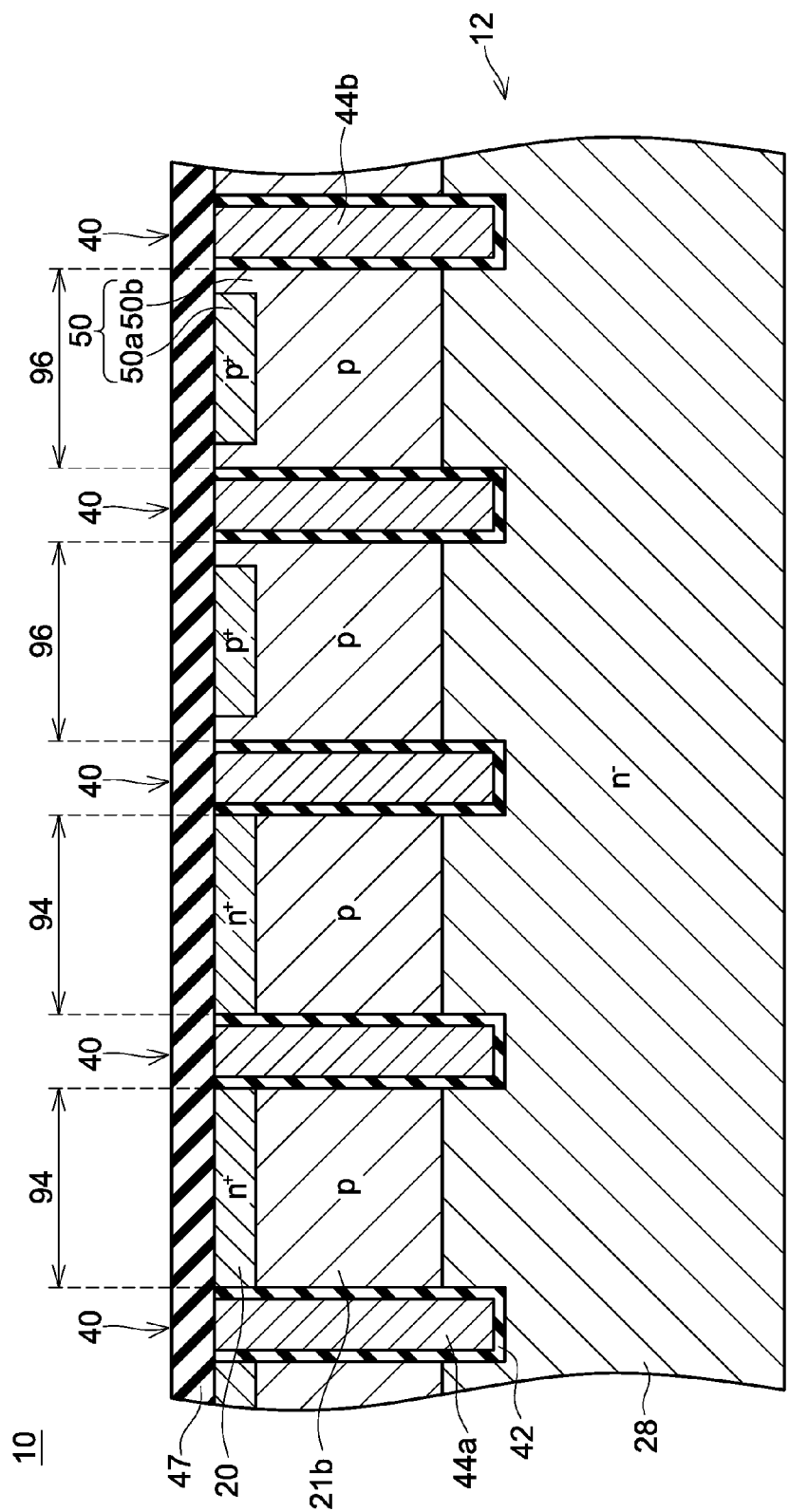
FIG. 4 shows a diagram indicating a manufacturing method of the IGBT 10 according to the embodiment.

(Manufacturing Process) Next, a method of manufacturing the semiconductor device 10 will be explained. The semiconductor device 10 is manufactured from an n-type semiconductor substrate (silicon substrate) having a substantially same n-type impurity concentration as the drift region 28. Firstly, the emitter regions 20, the body region 21, the drift region 28, the anode region 50, the trenches 40, the insulation film 42, and the trench electrodes 44 are formed. Subsequently, as shown in FIG. 4, an interlayer insulation film 47 is formed on the semiconductor substrate.

Figure 5:
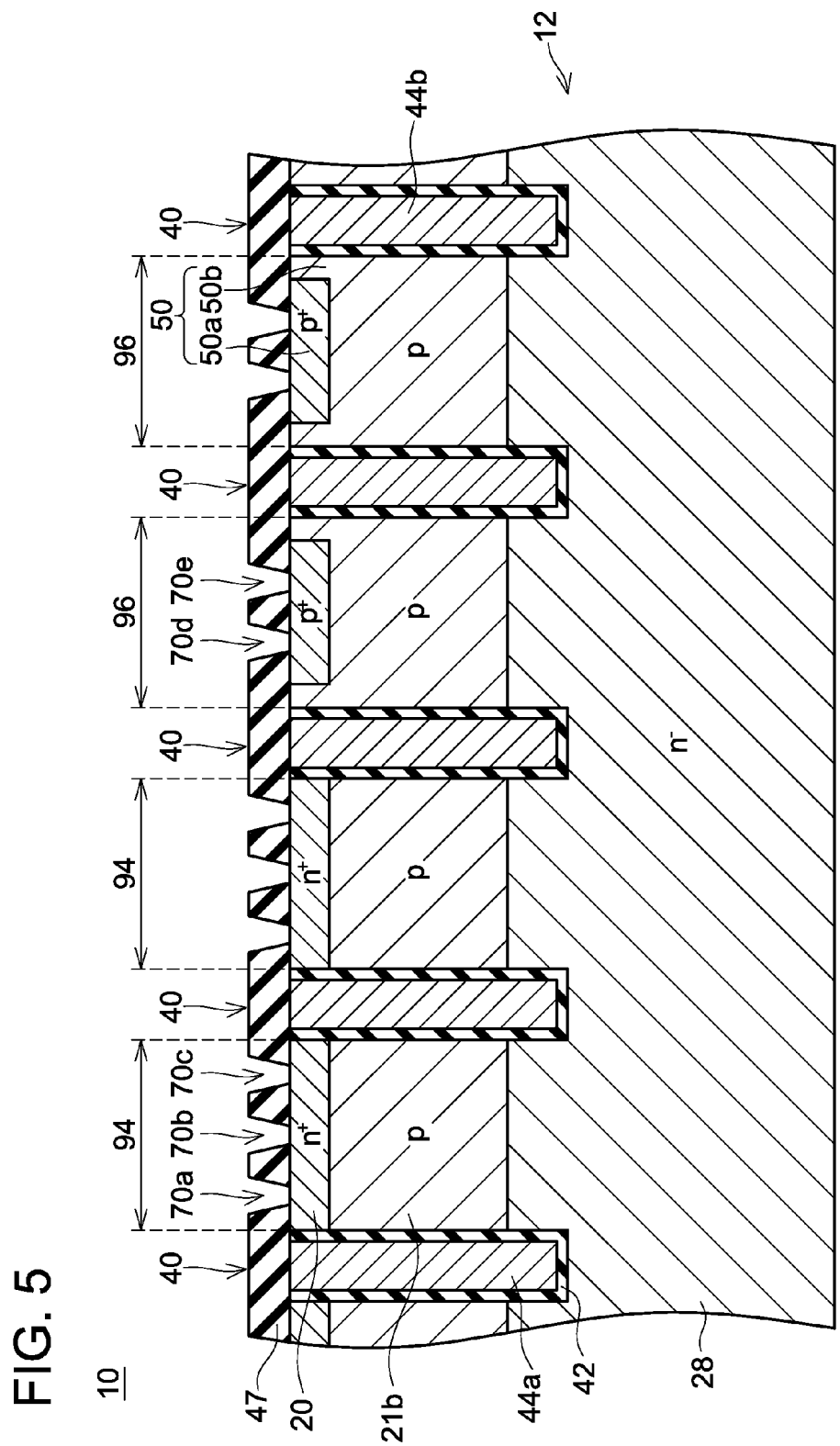
FIG. 5 shows a diagram indicating the manufacturing method of the IGBT 10 according to the embodiment.

Next, by selectively etching the interlayer insulation film 47, as shown in FIG. 5, the contact holes 70a to 70e are formed in the interlayer insulation film 47.

Figure 6:
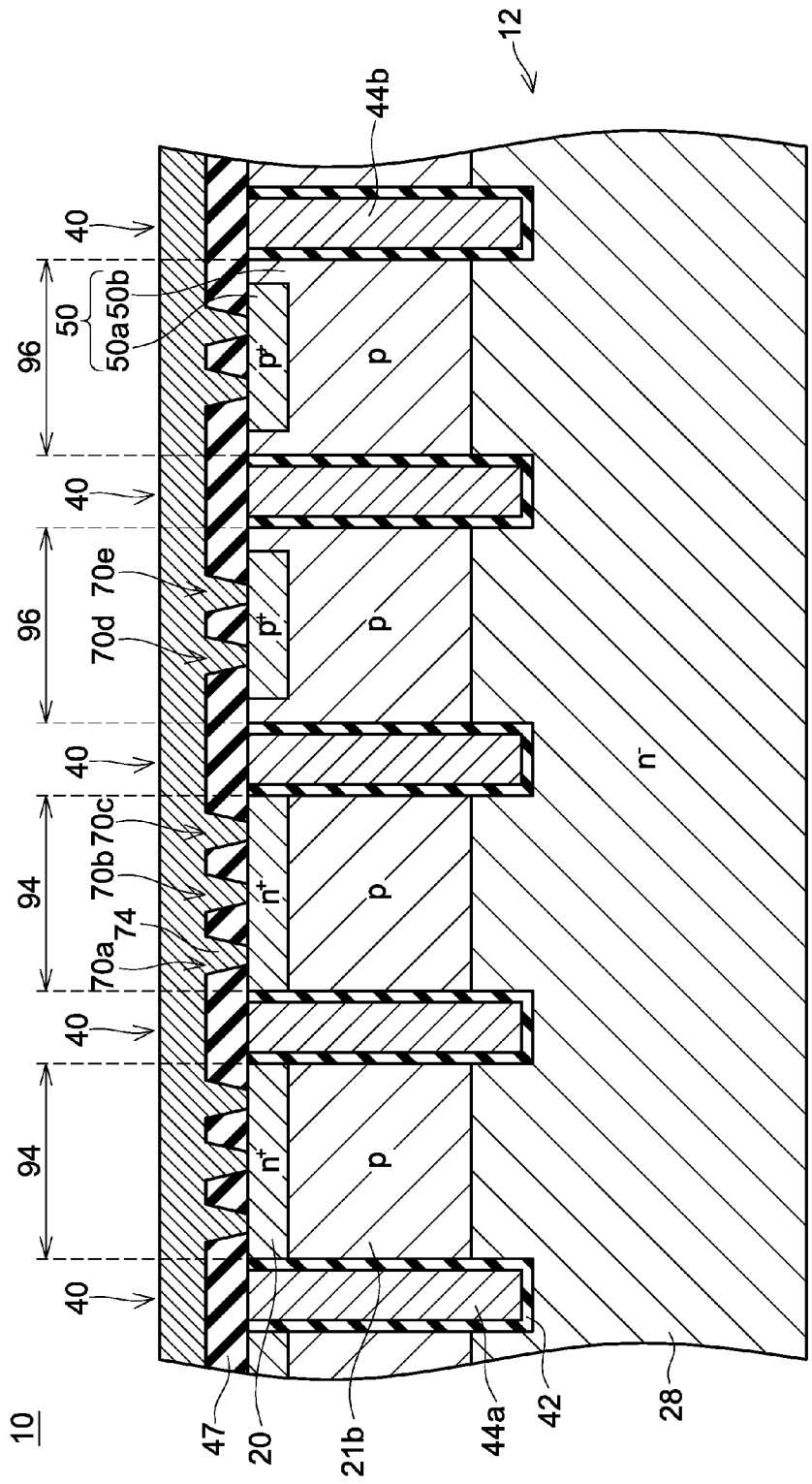
FIG. 6 shows a diagram indicating the manufacturing method of the IGBT 10 according to the embodiment.

Next, as shown in FIG. 6, a conductive layer 74 is formed in the contact holes 70 and on the interlayer insulation film 47. The conductive layer 74 is formed by CVD. The CVD allows the conductive layers 74 to be formed in the contact holes 70 with no gap between the contact holes 70 and the conductive layer 74.

Figure 7:
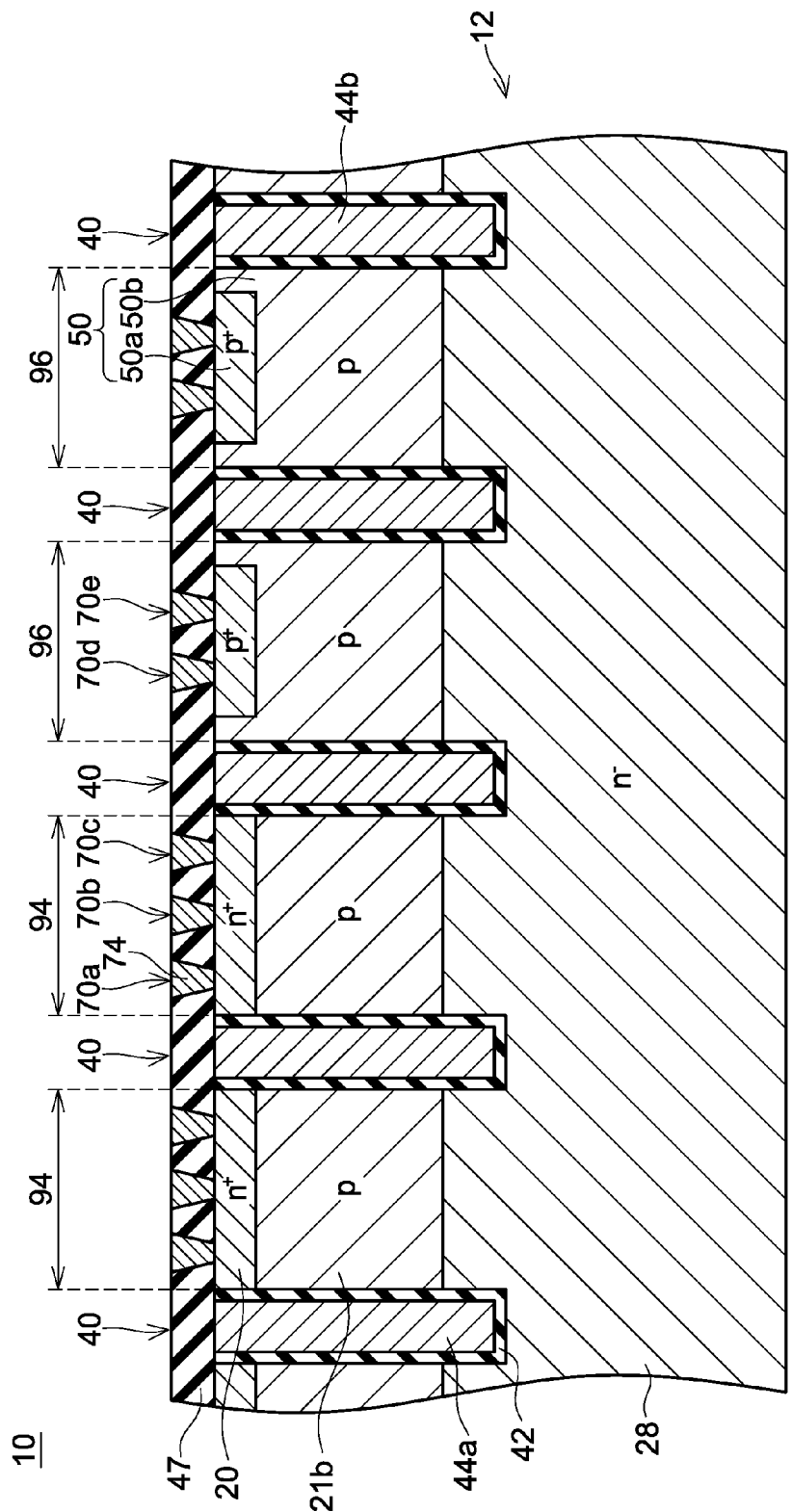
FIG. 7 shows a diagram indicating the manufacturing method of the IGBT 10 according to the embodiment.

Next, the conductive layer 74 on the interlayer insulation film 47 is removed by etching. Here, as shown in FIG. 7, the conductive layers 74 are left to remain in the contact holes 70. Due to this, an upper surface of the interlayer insulation film 47 and upper surfaces of the conductive layers 74 come to form a substantially flush surface. That is, the upper surface of the substrate is made flat.

Further, if the width of the contact holes is wide, upon etching the conductive layer 74, the upper surfaces of the conductive layers 74 in the contact holes are formed recessed. This is because the conductive layers 74 are etched more easily at centers of the contact holes. However, since the width of the contact holes 70 is narrow in the present embodiment, the upper surfaces of the conductive layers 74 can be formed to be substantially flat. Due to this, the upper surface of the substrate can be formed flat.

Figure 8:
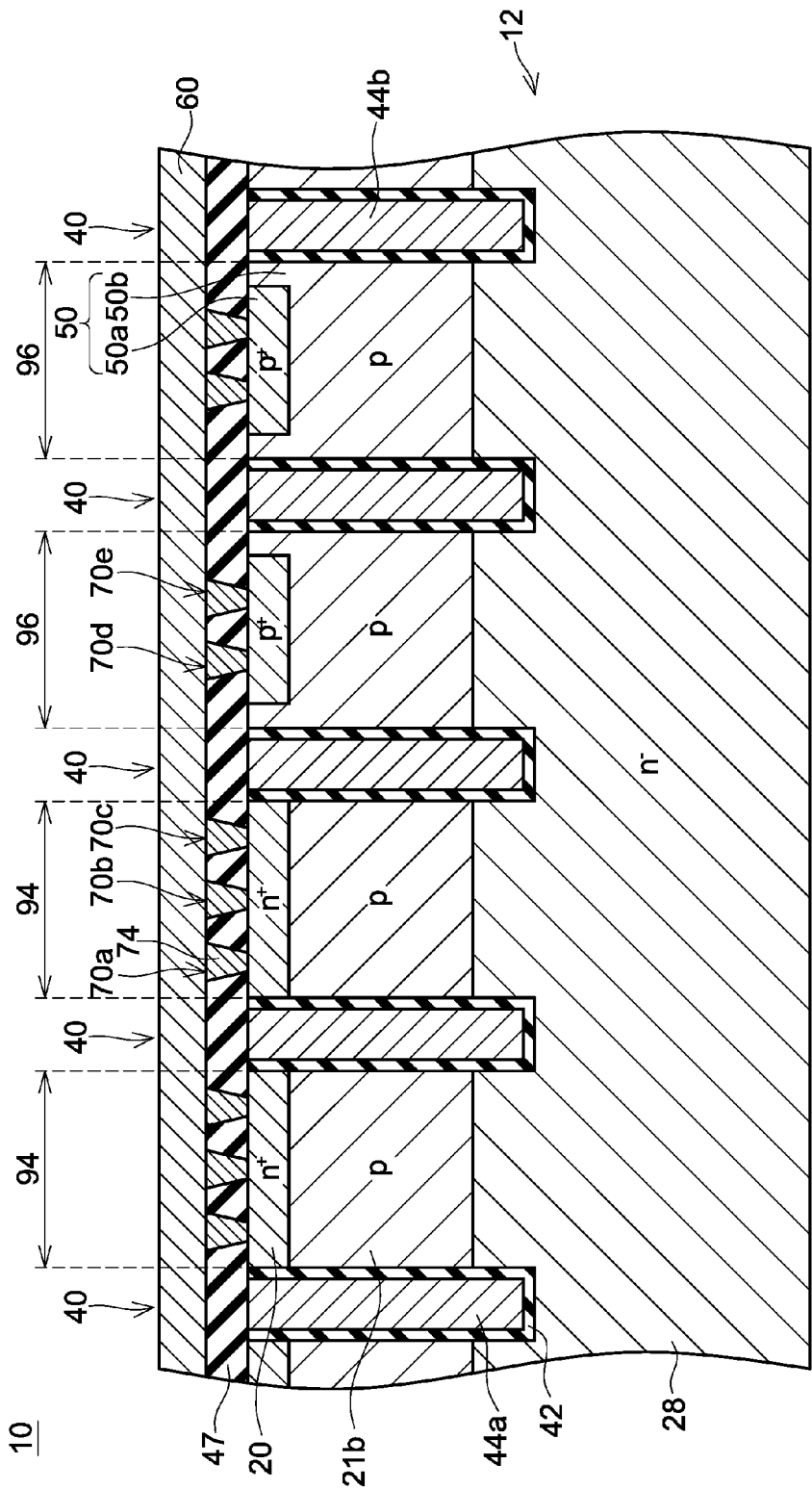
FIG. 8 shows a diagram indicating the manufacturing method of the IGBT 10 according to the embodiment.

Next, as shown in FIG. 8, the upper electrode 60 is formed on the interlayer insulation film 47 and the conductive layers 74. Since the upper surface of the substrate prior to forming the upper electrode 60 is flat, an upper surface of the upper electrode 60 is flat after the formation of the upper electrode 60.

Thereafter, by forming structures on a lower surface side, the semiconductor device 10 shown in FIGS. 1 to 3 is completed.

As mentioned above, the structure and the manufacturing method of the semiconductor device 10 of the present embodiment enable the upper surface of the upper electrode 60 to be formed flat. Due to this, the upper electrode 60 can be suitably connected to an external electrode or the like using solder or bonding wire.

Notably, in the above-mentioned embodiment, the conductive layer 74 was formed by CVD, but alternatively the conductive layer 74 may be formed by plating or sputtering. That is, as long as the conductive layer 74 is a conductive material formable by CVD, plating, or sputtering, the conductive layer 74 may be constituted of any material. For example, the conductive layer 74 may be constituted of W, Al, Cu, or an alloy containing any of W, Al, and Cu.

Notably, in the semiconductor device 10 in the embodiment, the two contact holes 70d and 70e were provided in each range 96 interposed between two trenches 40 in the diode region 92, but alternatively, one contact hole may be provided in each range 96, or three or more contact holes may be provided in each range 96. In these cases also, as mentioned above, it is preferable that the ratio of the contact area of the contact hole(s) is greater in the IGBT region 90 than that in the diode region 92.

Notably, the respective constituent features of the semiconductor device 10 in the above mentioned embodiment have following relationships with constituent features in the claims. The emitter regions 20 are an example of a first semiconductor layer in the claims. The body region 21 in the embodiment is an example of a second semiconductor layer in the claims. The drift region 28 and the buffer region 30 are examples of a third semiconductor layer in the claims. The conductive layers 74 in the IGBT region 90 in the embodiment are an example of a first conductor layer in the claims.

The upper electrode 60 in the embodiment is an example of a front surface electrode in the claims. The ranges 94 are an example of a first range in the claims. The anode region 50 in the embodiment is an example of a fourth semiconductor layer in the claims. The conductive layers 74 in the diode region 92 in the embodiment are an example of a second conductor layer in the claims.

Notably, in the above-mentioned embodiment, the semiconductor device 10 includes the collector region 32, but alternatively, the collector region 32 may be omitted. In this case, MOSFET is formed by the buffer region 30 being connected to the lower electrode.

Further, in the above-mentioned embodiment, the semiconductor device 10 includes the diode region 92, but alternatively the diode region 92 may not be provided.

A configuration of the semiconductor device 10 according to the embodiment can be described as follows.

A semiconductor device comprises: a semiconductor substrate; a plurality of trenches provided in an upper surface of the semiconductor substrate; trench insulating films covering inner surfaces of the respective trenches; trench electrodes each provided in a corresponding one of the trenches and insulated from the semiconductor substrate by the trench insulating film; a first semiconductor layer of a first conductivity type provided in the semiconductor substrate in a first range interposed between adjacent two of the trenches, exposed on the upper surface of the semiconductor substrate, and being in contact with the trench insulating film; a second semiconductor layer of a second conductivity type provided in the semiconductor substrate in the first range, a part of the second semiconductor layer being exposed on the upper surface of the semiconductor substrate, and the second semiconductor layer being in contact with the trench insulating film on a lower side of the first semiconductor layer; a third semiconductor layer of the first conductivity type provided in the semiconductor substrate, provided on a lower side of the second semiconductor layer, separated from the first semiconductor layer by the second semiconductor layer, and being in contact with the trench insulating film on the lower side of the second semiconductor layer; an interlayer insulating film provided on the upper surface of the semiconductor substrate and on the trench electrodes, and comprising a plurality of contact holes provided in the first range; first conductor layers each provided in a corresponding one of the contact holes and connected to at least one of the first semiconductor layer and the second semiconductor layer; and a surface electrode provided on the first conductor layers and the interlayer insulating film and connected to each of the first conductor layers.

The above mentioned semiconductor device may further comprise a fourth semiconductor layer of the first conductivity type provided in the semiconductor substrate in a second range different from the first range and interposed between adjacent two of the trenches, and exposed on the upper surface of the semiconductor substrate; and a second conductor layer. A part of the third semiconductor layer may be provided on a lower side of the fourth semiconductor layer and be in contact with the fourth semiconductor layer, the interlayer insulating film may comprise a contact hole provided in the second range, the second conductor layer may be provided in the contact hole in the second range and connected to the fourth semiconductor layer, a part of the surface electrode may be provided on the second conductor layer and connected to the second conductor layer, and a value obtained by dividing a contact area of the plurality of the first conductor layers with respect to the semiconductor substrate by an area of the first range may be greater than a value obtained by dividing a contact area of the second conductor layer with respect to the semiconductor substrate by an area of the second range.

By thus making the contact area in the first range large, performance of the switching device provided in the first range can be improved. Also by making the contact area in the second range small, a reverse recovery characteristic of a diode provided in the second range can be improved.

Young's modulus of the first conductor layers may be higher than Young's modulus of the surface electrode.

According to this configuration, even when a stress generates a crack in the front surface electrode, the crack can be prevented from running toward the semiconductor substrate side.

The first conductor layers and the second conductor layer may be constituted of a material formable by CVD, plating, or sputtering.

According to this configuration, the conductive layer can suitably be formed in the contact holes.

The first conductor layers and the second conductor layer may be constituted of a material comprising any of W, Al, and Cu.

A width of the interlayer insulating film on each of the trench electrodes may be wider than a width of the interlayer insulating film interposed between the contact holes in the first range.

Further, the method of manufacturing the semiconductor device in the embodiments is a method of manufacturing a semiconductor device from a production wafer, and comprises the followings. The production wafer comprises a semiconductor substrate comprising a plurality of trenches provided in an upper surface of the semiconductor substrate; trench insulating films covering inner surfaces of the respective trenches; and trench electrodes each provided in the corresponding trench and insulated from the semiconductor substrate by the trench insulating film. The semiconductor substrate comprises: a first semiconductor layer of a first conductivity type provided in a range interposed between adjacent two of the trenches, exposed on the upper surface of the semiconductor substrate, and being in contact with the trench insulating film; a second semiconductor layer of a second conductivity type provided in the range, a part of the second semiconductor layer being exposed on the upper surface of the semiconductor substrate, and the second semiconductor layer being in contact with the trench insulating film on a lower side of the first semiconductor layer; and a third semiconductor layer of the first conductivity type, provided on a lower side of the second semiconductor layer, separated from the first semiconductor layer by the second semiconductor layer, and being in contact with the trench insulating film on the lower side of the second semiconductor layer. The method comprises: forming an interlayer insulating film on an upper surface of the production wafer; forming a plurality of contact holes in the interlayer insulating film in the range; growing a conductor layer in the contact holes and on the interlayer insulating film; etching the conductor layer on the interlayer insulating film so that the conductor layer remains in the contact holes; and forming a surface electrode on the conductor layer and the interlayer insulating film after the etching.

According to this manufacturing method, the front surface electrode can be made flat, and also, the front surface electrode can be allowed to have a wide contact area.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

The invention claimed is:

1. A semiconductor device comprising:
a semiconductor substrate;
a plurality of trenches provided in an upper surface of the semiconductor substrate;
trench insulating films each covering a corresponding one of inner surfaces of the trenches;
trench electrodes each provided in a corresponding one of the trenches and insulated from the semiconductor substrate by the trench insulating film;
a first semiconductor layer of a first conductivity type provided in the semiconductor substrate in a first range interposed between adjacent two of the trenches, exposed on the upper surface of the semiconductor substrate, and being in contact with the trench insulating film;
a second semiconductor layer of a second conductivity type provided in the semiconductor substrate in the first range, a part of the second semiconductor layer being exposed on the upper surface of the semiconductor substrate, and the second semiconductor layer being in contact with the trench insulating film on a lower side of the first semiconductor layer;
a third semiconductor layer of the first conductivity type provided in the semiconductor substrate, provided on a lower side of the second semiconductor layer, separated from the first semiconductor layer by the second semiconductor layer, and being in contact with the trench insulating film on the lower side of the second semiconductor layer;
an interlayer insulating film provided on the upper surface of the semiconductor substrate and on the trench electrodes, and comprising a plurality of contact holes provided in the first range;
first conductor layers each provided in a corresponding one of the contact holes and connected to at least one of the first semiconductor layer and the second semiconductor layer; and
a surface electrode provided on the first conductor layers and the interlayer insulating film and connected to each of the first conductor layers,
wherein
each of the contact holes extends parallel to the trenches,
the contact holes located in the first range are arranged adjacent to each other in a width direction of the first range with intervals between the contact holes, and
the width direction is a direction extending from one of the adjacent two trenches to the other of the adjacent two trenches.

2. The semiconductor device of claim 1, further comprising:
a fourth semiconductor layer of the second conductivity type provided in the semiconductor substrate in a second range different from the first range and interposed between adjacent two of the trenches, and exposed on the upper surface of the semiconductor substrate; and a second conductor layer,
wherein
a part of the third semiconductor layer is provided on a lower side of the fourth semiconductor layer and being in contact with the fourth semiconductor layer,
the interlayer insulating film comprises a contact hole provided in the second range,
the second conductor layer is provided in the contact hole in the second range and connected to the fourth semiconductor layer,
a part of the surface electrode is provided on the second conductor layer and connected to the second conductor layer, and
a value obtained by dividing a contact area of the plurality of the first conductor layers with respect to the semiconductor substrate by an area of the first range is greater than a value obtained by dividing a contact area of the second conductor layer with respect to the semiconductor substrate by an area of the second range.

3. The semiconductor device of claim 1, wherein Young's modulus of the first conductor layers is higher than Young's modulus of the surface electrode.

4. The semiconductor device of claim 1, wherein the first conductor layers are constituted of a material formable by CVD, plating, or sputtering.

5. The semiconductor device of claim 1, wherein the first conductor layers are constituted of a material comprising any of W, Al, and Cu.

6. The semiconductor device of claim 1, wherein a width of the interlayer insulating film on each of the trench electrodes is wider than a width of the interlayer insulating film interposed between the plurality of the contact holes in the first range.

7. A method of manufacturing a semiconductor device from a production wafer that comprises:
a semiconductor substrate comprising a plurality of trenches provided in an upper surface of the semiconductor substrate;
trench insulating films each covering a corresponding one of inner surfaces of the trenches; and
trench electrodes each provided in a corresponding one of the trenches and insulated from the semiconductor substrate by the trench insulating film,
the semiconductor substrate comprises:
a first semiconductor layer of a first conductivity type provided in a range interposed between adjacent two of the trenches, exposed on the upper surface of the semiconductor substrate, and being in contact with the trench insulating film;
a second semiconductor layer of a second conductivity type provided in the range, a part of the second semiconductor layer being exposed on the upper surface of the semiconductor substrate, and the second semiconductor layer being in contact with the trench insulating film on a lower side of the first semiconductor layer; and
a third semiconductor layer of the first conductivity type provided on a lower side of the second semiconductor layer, separated from the first semiconductor layer by the second semiconductor layer, and being in contact with the trench insulating film on the lower side of the second semiconductor layer;
the method comprising:
forming an interlayer insulating film on an upper surface of the production wafer;
forming a plurality of contact holes in the interlayer insulating film in the range, each of the contact holes extending parallel to the trenches, and the contact holes being arranged in a width direction of the range with intervals between the contact holes;

growing a conductor layer in the contact holes and on the interlayer insulating film;

etching the conductor layer on the interlayer insulating film so that the conductor layer remains in the contact holes; and forming a surface electrode on the conductor layer and the interlayer insulating film after the etching.

8. The semiconductor device of claim 1, wherein the width direction is perpendicular to each of the trenches.

* * * * *